(12) United States Patent
Tucker

(10) Patent No.: US 6,400,297 B1
(45) Date of Patent: Jun. 4, 2002

(54) METHOD AND SYSTEM FOR OPERATING TWO OR MORE INTEGRATORS WITH DIFFERENT POWER SUPPLIES FOR AN ANALOG-TO-DIGITAL DELTA-SIGMA MODULATOR

(75) Inventor: John Christopher Tucker, Columbia, MD (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 09/843,393

(22) Filed: Apr. 26, 2001

(51) Int. Cl.$^7$ .................................................. H03M 3/00
(52) U.S. Cl. ....................................................... 341/143
(58) Field of Search ................................. 341/143, 155, 341/144, 163, 110

(56) References Cited

U.S. PATENT DOCUMENTS 6,344,811 B1 * 2/2002 Melanson .................. 341/143

* cited by examiner

Primary Examiner—Brian Young
(74) Attorney, Agent, or Firm—Steven Lin, Esq.

(57) ABSTRACT

A method and system are disclosed for operating two or more integrator amplifiers with different power supplies for a modulator of an analog-to-digital ("A/D") converter. A first, upstream integrator is operated with one power supply, and the other downstream integrator(s) is/are operated with at least another power supply. The modulator has amplifiers with coefficient gains having values that are determined and set so that voltage levels for the at least another integrator are maintained within operating and output limits. An integrating coefficient gain k1 for the first integrator is set to have a sufficiently large value so that an integrating capacitor can be made small for the one integrator. Another integrating coefficient gain k2 for a second integrator is set to have a sufficiently small value so that an output voltage from the first integrator is sufficiently attenuated to a voltage value within an operating range of the second integrator.

26 Claims, 2 Drawing Sheets

METHOD AND SYSTEM FOR OPERATING TWO OR MORE INTEGRATORS WITH DIFFERENT POWER SUPPLIES FOR AN ANALOG-TO-DIGITAL DELTA-SIGMA MODULATOR

CROSS-REFERENCED PATENT APPLICATIONS

This application relates to and cross-references U.S. patent application Ser. No. 09/843,196 entitled "METHOD AND SYSTEM FOR OPERATING TWO OR MORE DYNAMIC ELEMENT MATCHING (DEM) COMPONENTS WITH DIFFERENT POWER SUPPLIES FOR A DELTA-SIGMA MODULATOR OF AN ANALOG-TO-DIGITAL CONVERTER" which has been contemporaneously filed on the same date as the present application. The present patent application also cross-references pending U.S. patent application Ser. No. 09/591,124 filed on Jun. 9, 2000 to Allen et al. entitled "VOLTAGE LEVEL SHIFTER" (hereafter referred to as "Allen et al. patent application"), which has been assigned to CIRRUS LOGIC, INC., Austin, Tex. The Allen et al. patent application is incorporated by reference herein in its entirety.

BACKGROUND OF THE INVENTION

1. Technical Field

The present invention relates in general to an analog-to-digital converter, and, in particular, to a modulator for an analog-to-digital ("A/D") converter. Still more particularly, the present invention relates to a method and system for operating two or more integrator amplifiers with different power supplies for an A/D delta-sigma modulator.

2. Description of the Related Art

Analog-to-digital converters ("ADCs") are used to convert an analog signal to a digital signal for digital processing and/or storage. A delta-sigma modulator operates to digitize an analog input signal for an analog-to-digital converter. A delta-sigma modulator for an analog-to-digital ("A/D") converter generally includes at least an integrator, a summation circuit, and a quantizer coupled together. The integrator performs integration operations on the input signal while the summation circuit adds the integrated signals from the integrator. Some delta-sigma modulators have multiple integrators, which provide multiple stages of integration. The quantizer operates to quantify the added outputs from the summation circuit to provide a digitized signal.

Ideal ADCs digitize the signals without adding any noise. However, due to inherent noise of electrical circuits, the electrical circuits of ADCs add at least some amount of noise (e.g., predominantly including but not limited to thermal noise) to the signals. The dynamic range generally measures the performance of an ADC. The dynamic range is the ratio of the power of the largest signal, which the ADC can digitize to the power of the noise (e.g., "noise power") added by the ADC. A desired goal in the design of ADCs is to increase the dynamic range. Ways to accomplish increasing the dynamic range is to reduce the noise power and/or increase the signal power.

In reducing noise power, thermal noise is examined. Thermal noise power is proportional to $2kT/(C*OSR)$, in which k is the Boltzmann's constant, T is the temperature, C is the sampling capacitance, and OSR is the oversampling ratio. For example, if the sampling capacitance or oversampling ratio is doubled, then a reduction of three (3) decibels (dB) in the noise power occurs. In order to achieve a twelve (12) dB reduction in the noise power, the capacitor size to oversampling ratio has to be sixteen (16) times larger. The approach of reducing noise power in this manner results in the disadvantages of having to significantly increase the capacitor size and capacitor area. The cost of the chip would significantly increase if the capacitor size and area would have to be increased.

In increasing signal power, the signal power is analyzed. The signal power is proportional to $(Vrms)^2$, in which Vrms is the root mean square ("rms") voltage of the input signal. For example, the rms voltage only needs to be increased by a factor four (4) in order to achieve a 12dB increase in the dynamic range. Furthermore, the analog circuits that are "upstream" in the ADC do not more easily limit the dynamic range of the system. However, the increase of the signal power results in some problems. First, in order to accommodate the larger signal voltages, the circuits must be fabricated from high voltage integrated circuit devices, such as transistors, resistors, capacitors, etc., which are all able to handle high voltages. High voltage circuit devices are generally much physically larger in size and occupation of area than low voltage circuit devices. For example, high voltage transistors may occupy ten (10) to twenty (20) times the physical area compared with low voltage transistors. Secondly, the high voltage circuits consume a more significant amount of power than respective low voltage circuits. For instance, a high voltage circuit with an 18 volt power supply may consume over five (5) times as much power as a low voltage circuit having a 3.3 volt power supply.

Typically, a single power supply drives all components of a delta-sigma modulator. For example, the same power supply would drive the integrator amplifiers of all of the integrators in a delta-sigma modulator. Modulator technology has developed such that a large power voltage, such as 5 volts or higher, is able to drive the modulator. The large power voltage allows the A/D converter to receive and process analog input signals in a wide voltage range, which results in the A/D converter having a wider dynamic range and a higher signal-to-noise ratio. However, physically large components, such as large-sized transistors, are needed for the A/D converter to operate under the large voltage. The use of physically large components makes the size and cost of the A/D converter chip respectively larger and higher. Also, since a large power voltage drives the modulator components, then the A/D converter consumes greater overall power.

The present invention recognizes the need to maintain a large power voltage driving the delta-sigma modulator so that at least a wider dynamic range and a higher signal-to-noise ratio is provided for the A/D converter. At the same time, however, the present invention recognizes the continual need and desire to maintain or reduce the overall physical size, cost, and power consumption of an A/D converter chip.

SUMMARY OF THE INVENTION

A method and system are disclosed for operating two or more integrator amplifiers with different power supplies for a modulator of an analog-to-digital ("A/D") converter. A first, upstream integrator is operated with one power supply, and the other downstream integrator(s) is/are operated with at least another power supply. The modulator has amplifiers with coefficient gains having values that are determined and set so that voltage levels for the at least another integrator are maintained within operating and output limits. An integrating coefficient gain k1 for the first integrator is set to have a sufficiently large value so that an integrating capacitor can be made small for the one integrator. Another integrating coefficient gain k2 for a second integrator is set to have a sufficiently small value so that an output voltage from the first integrator is sufficiently attenuated to a voltage value within an operating range of the second integrator.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF ILLUSTRATIVE EMBODIMENT

A method and system are disclosed for operating two or more integrator amplifiers with different power supplies for a modulator of an analog-to-digital ("A/D") converter. A first integrator that is an upstream integrator is operated with one power supply, and the other downstream integrator(s) is/are operated with at least another power supply. The coefficients of the modulator are designed so that the gain(s) before the downstream integrator(s) sufficiently attenuate(s) the voltage of the signal so that the power of the signal is within the operating range of the downstream integrator(s).

Figure 1:
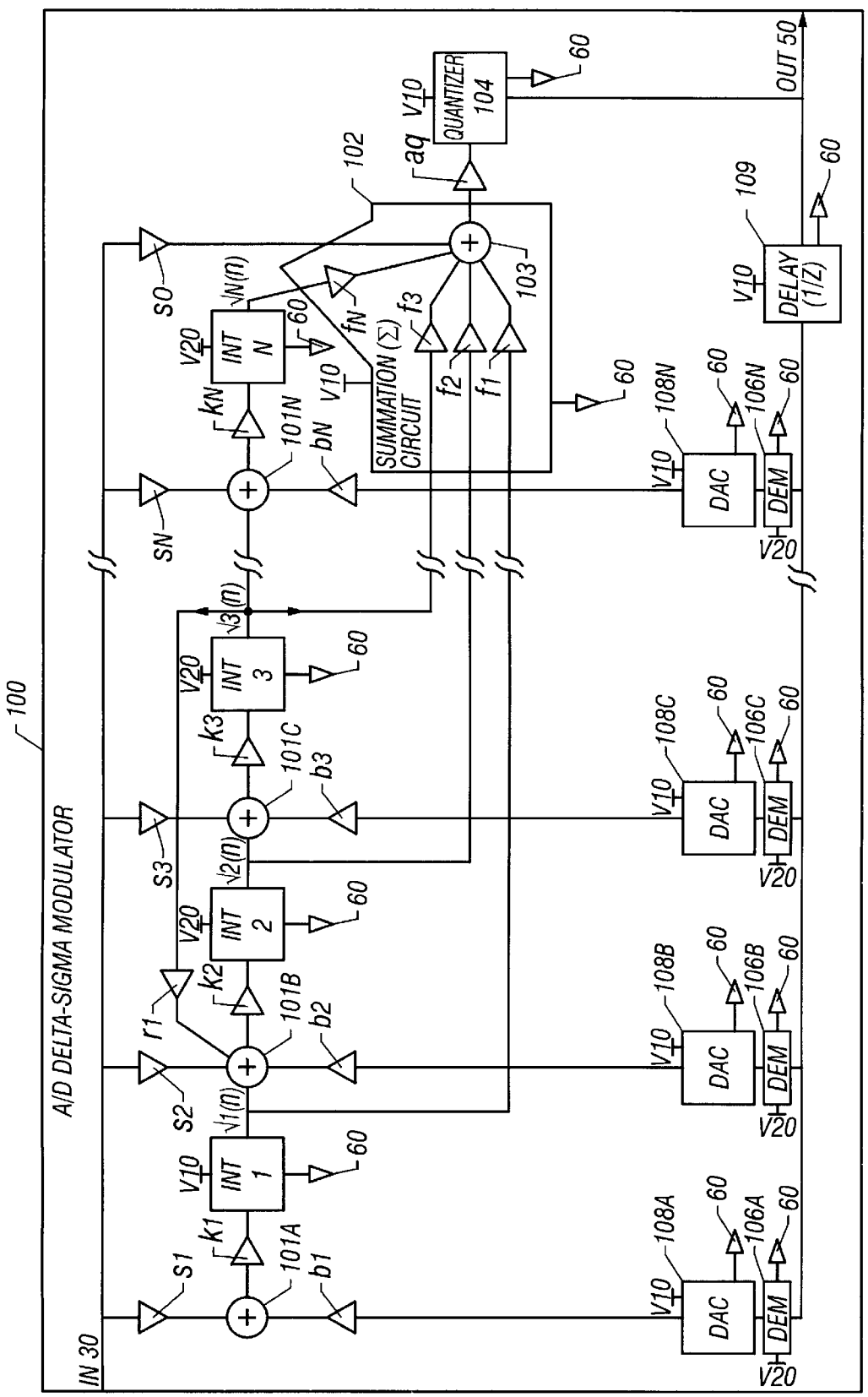
FIG. 1 is a block diagram of an exemplary delta-sigma modulator for an analog-to-digital ("A/D") converter in accordance with the present invention.
Figure 3:
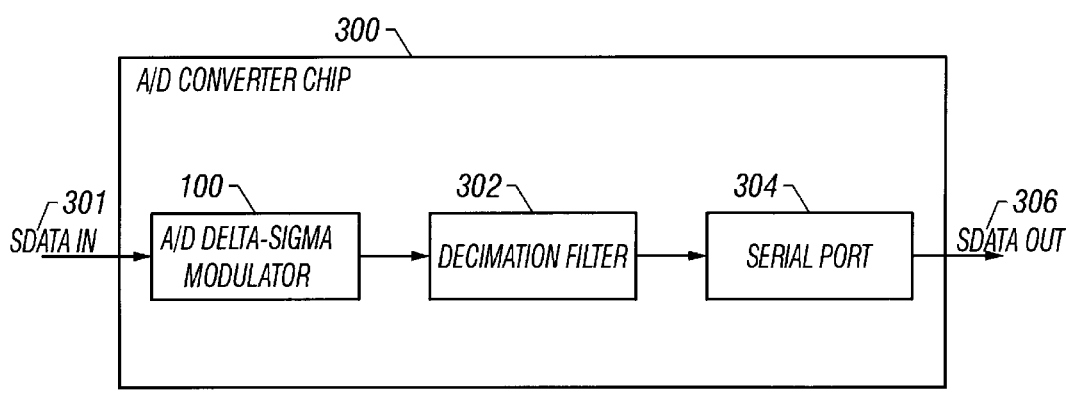
FIG. 3 is a block diagram of an exemplary A/D converter chip that incorporates the delta-sigma modulator of FIG. 1.

With reference now to FIG. 1, a block diagram of an exemplary delta-sigma modulator 100 for an analog-to-digital ("A/D") converter, such as an A/D converter chip 300 in FIG. 3, in accordance with the present invention is shown. Delta-sigma modulator 100 has integrators 1, 2, 3, ... N ("INT 1, 2, 3 ... N") coupled in series as shown in FIG. 1. Integrators 1, 2, 3 ... N is each coupled to a summation (Σ) circuit 102 having a summing amplifier 103. Summation circuit 102 is, in turn, coupled in series with a quantizer (Q) 104 as further shown in FIG. 1. Quantizer 104 provides output ("OUT") signal 50. Output signal 50 is fed back to a delay (1/Z) 109. Delay 109 is coupled and fed back in parallel to dynamic-element-matching ("DEM") systems 106A, 106B, 106C ... 106N. DEM systems 106A, 106B, 106C ... 106N are respectively coupled in series with corresponding digital-to-analog converters ("DACs") 108A, 108B, 108C ... 108N as shown in FIG. 1. DACs 108A, 108B, 108C ... 108N are respectively coupled in series with corresponding summing amplifiers 101A, 101B, 101C ... 101N as shown in FIG. 1. Summing amplifiers 101A, 101B, 101C ... 101N are respectively coupled in series with inputs to integrators 1, 2, 3, ... N.

A power supply V10, that provides a high voltage between its specified power-supply voltage and ground ("GND") 60, drives first integrator 1 (e.g., upstream integrator), summation circuit 102, quantizer 104, and DACs 108A, 108B, 108C ... 108N. Another power supply V20, which supplies a low voltage between its specified power supply voltage and GND 60 which is a different voltage (e.g., lower voltage) from the power supply voltage (e.g., high voltage) of power supply V10, drives downstream integrators 2, 3, 4, 5 ... N and DEM systems 106A, 106B, 106C ... 106N. Modulator 100 has multiple power supplies (e.g., two power supplies V10 and V20) that are used to drive the modulator components. First integrator 1, summation circuit 102, quantizer 104, and DACs 108A, 108B, 108C ... 108N are driven by a relatively high power voltage (e.g., 5 volts or higher) supplied by power supply V10 while downstream integrators 2, 3, 4, 5 ... N and DEM systems 106A, 106B, 106C ... 106N are driven by a relatively low power voltage (e.g., less than 5 volts) supplied by power supply V20. For example, power supply V10 may provide a power supply voltage of 16 volts to the one set of components while power supply V20 may provide a power supply voltage of 3.3 volts to the other set of components. Components that are driven by a relatively low power voltage for modulator 100 are generally smaller in physical size and consume less power than components driven by a relatively high power voltage. The use of modulator components that are driven by different power supply voltages (e.g., a relatively high power voltage and low power voltage) from two or more power sources allows modulator 100 and A/D converter chip 300 incorporating modulator 100 to be smaller in physical size and to consume less power during operation.

As for the operation of delta-sigma modulator 100, an analog input ("IN") signal 30 is fed and inputted into first integrator 1 via summing amplifier 101A. First integrator 1, which is for the first, upstream integrator, performs 30 an integration operation on IN signal 30. Integrated output signal from integrator 1 is, in turn, fed and inputted into integrator 2 via summing amplifier 101B. Downstream integrator 2 performs a further integration operation on the received signal from integrator 1. Downstream integrators 3 to N, which are coupled in series with integrators 1 and 2, perform similarly repeated integration operations on IN signal 30 as integrators 1 and 2 do. IN signal 30 and outputs from integrators 1, 2, 3 ... N are fed as inputs into summing amplifier 103 of summation circuit 102. Summing amplifier 103 of summation circuit 102 adds together IN signal 30 and the outputs from integrators 1, 2, 3 ... N. The resulting summed output from summation circuit 102 is fed as an input signal into quantizer 104. Quantizer 104 quantifies and digitizes the summed output from summation circuit 102 as a digitized, output ("OUT") signal 50 for delta-sigma modulator 100. OUT signal 50 is fed back to delay 109, which delays OUT signal 50. Delayed OUT signal 50 is respectively fed back in parallel to DEM systems 106A, 106B, 106C ... 106N and DACs 108A, 108B, 108C ... 108N. DACs 108A, 108B, 108C ... 108N convert received delayed OUT signal 50 back to an analog signal on which integrator(s) 1, 2, 3 ... N can further perform an integration operation(s). DEM systems 106A, 106B, 106C ... 106N receive delayed OUT signal 50 and track usage of the components or elements of respective DACs 108A, 108B, 108C ... 108N and linearizes operations of DACs 108A, 108B, 108C ... 108N.

Referring again to FIG. 1 as for the design of delta-sigma modulator 100, the coefficient gains for delta-sigma modulator 100 are shown. Amplifiers having input signal coefficient gains s0, s1, s2, s3, ... sN are respectively coupled in series with corresponding summing amplifiers 103, 101A, 101B, 101C ... 101N. Amplifiers with integrating coefficient gains k1, k2, k3 . . . kN are respectively coupled in series to inputs of corresponding integrators 1, 2, 3, . . . N. Amplifiers with feedforward coefficient gains f1, f2, f3 . . . fN are respectively coupled in series between the outputs of integrators 1, 2, 3, . . . N and summing amplifier 103. Also, amplifiers having feedback coefficient gains b1, b2, b3 . . . bN are coupled in series between DACs 108A, 108B, 108C . . . 108N and summing amplifiers 101A, 101B, 101C . . . 101N. An amplifier with resonator coefficient gain r1 is coupled in the feed back loop from the output of integrator 3 to summing amplifier 101B. An amplifier with quantizer gain aq is coupled between summing amplifier 103 and quantizer 104.

The coefficient gains of delta-sigma modulator 100 generally have values that are less than or equal to one. Delta-sigma modulator 100, which is driven by multiple power supplies V10 and V20, is designed so that the voltage values throughout delta-modulator 100 are within the operating voltage limits of the modulator components, particularly for the low-powered integrators 2, 3, . . . N. For a feedforward architecture as shown in delta-sigma modulator 100 of FIG. 1, the values for feedback coefficient gains b2 to bN are all set equal to zero (0) (e.g., in essence, the paths with amplifier having feedback coefficient gains b2 to bN do not exist), and feedback coefficient gain b1 is set equal to one (1) (e.g., the path with amplifier having feedback coefficient gain b1 still exists). Alternatively, for a feedback architecture, the values for feedforward coefficient gains f1 to f(N−1) are all set equal to zero (0) (e.g., in essence, the paths with amplifier having feedforward coefficient gains f1 to f(N−1) do not exist), and feedforward coefficient gain f(N) is set equal to one (1) (e.g., the path with amplifier having feedforward coefficient gain f(N) still exists). Delta-sigma modulator 100 has an exemplary feedforward architecture. However, the present invention is not in any way limited to a particular architecture, such as a feedback architecture or a feedforward architecture, or to any set of coefficient gain values. Any suitable modulator design with any appropriate set of coefficient gain values may be used in providing and implementing the present invention.

The selection and setting of the coefficient gains so that delta-sigma modulator 100, which is driven by multiple power supplies V10 and V20, operate within voltage limits are discussed later in more detail. At this time, integrators 1, 2, 3 . . . N are discussed. Integrators 1, 2, 3 . . . N may be delaying or non-delaying integrators.

Figure 2:
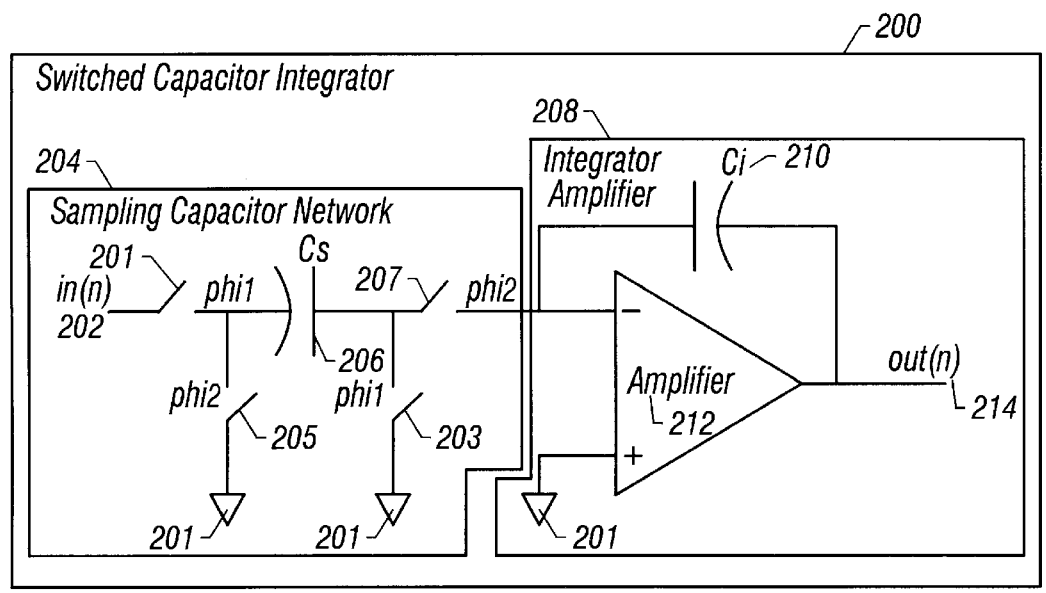
FIG. 2 is a block diagram of an exemplary delaying integrator that may be used for each of the integrators in the delta-sigma modulator of FIG. 1 in accordance with the present invention.

Referring now to FIG. 2, an exemplary delaying integrator 200, which may be integrator 1, 2, 3, . . . , or N in delta-sigma modulator 100, is shown. Integrator 1 would be a high-powered delaying integrator 200 while integrators 2, 3, . . . N are low-powered delaying integrators 200. Integrator 200 is a single ended integrator having a single output ("out(n)") 214. Integrator 200 has a sampling capacitor network 204 and an integrator amplifier 208. Sampling capacitor network 204 has switches 201, 203, 205, and 207 and a sampling capacitor Cs 206. Capacitor Cs 206 is coupled in series between switches 201 and 207 as shown in FIG. 2. Switch 205 is coupled between the input of sampling capacitor Cs 206 and ground 201, and switch 203 is coupled between the output of sampling capacitor Cs 206 and ground 201. Switch 207 is coupled between the output of sampling capacitor Cs 206 and the input of integrator amplifier 208. Integrator amplifier 208 includes an amplifier 212 and an integrating capacitor Ci 210. Integrating capacitor Ci 210 is coupled between the negative input of amplifier 212 and output 214 of amplifier 212. The positive input of amplifier 212 is coupled to ground 201.

Input in(n) signal 202 is inputted in series into sampling capacitor network 204 through switch 201. Phi1 and phi2 represent non-overlapping clock signals. When the "phi1" clock signal is high (e.g., switches 201 and 203 are closed) and the "phi2" clock signal is low (e.g., switches 205 and 207 are opened), then capacitor Cs 206 charges, and no changes occur at integrator amplifier 208. Furthermore, when the "phi1" clock signal is low (e.g., switches 201 and 203 are opened) and the "phi2" clock signal is high (e.g., switches 205 and 207 are closed), then capacitor Cs 206 discharges and transfers its charge to capacitor Ci 210 of integrator amplifier 210. The process of charge, discharge, and transfer of capacitors Cs 206 and Ci 210 repeatedly continues according to the non-overlapping clock signals "phi1" and "phi2" in performing integration. For input IN signal 30, the capacitor ratio of integrator 200 is as follows: Cs/Ci=s1*k1. For the output OUT signal 50, the capacitor ratio of integrator 200 is as follows: Cs/Ci=b1*k1.

Integrator 200, which is used for first (upstream) integrator 1, has a noise floor (e.g., noise power added) of delta-sigma modulator 100, that is set by the thermal noise sampled by sampling capacitor Cs 206. Integrator 1 operates from a high power supply voltage, such as 18 volts and contains high voltage transistors as needed. A high voltage integrator 1 can safely integrate the large voltages without damaging the circuit devices. The high voltage supply also improves the gain linearity of integrator amplifier 208. Additionally, the high voltage integrator 1 allows for larger values for output "out(n)" signal 214. Therefore, k1 can be made to be a large or larger value, and integrating capacitor Ci 210 can be made to be a small or smaller sized capacitor, which provides savings in physical circuit area.

Integrators 200, which are utilized for downstream integrators 2 to N, operate from low power supply voltages, such as 3.3 volts. These integrators 2 to N can be made from much smaller MOS-FET transistors, which significantly reduces circuit area and power consumption. Performance requirements of downstream integrators 2 to N are much less than that of integrator 1. Noise added into integrators 2 to N can be much higher than noise added into integrator 1. Linearity of integrators 2 to N can also be much lower than the linearity of integrator 1. The reason for the lower performance requirements is that errors introduced inside the delta-sigma loop of delta-sigma modulator 100 are attenuated by the gain of previous stages. For example, errors introduced by integrator 2 are attenuated by the gain of integrator 1.

However, the coefficient gains of delta-sigma modulator 100 must be scaled (e.g., coefficient scaling) so that the voltage values of V1(n), V2(n), V3(n) . . . VN(n) as shown in FIG. 1 do not exceed the output limits and voltage operating ranges of the amplifiers of low voltage integrators 2 to N. Since integrator amplifiers 208 of integrators 2 to N are powered by a 3.3 volt power supply, then outputs of integrators 2 to N are limited to a differential of approximately 3 volts.

For example, FIG. 1 illustrates a fifth order delta-sigma feedforward modulator 100 as the exemplary modulator for the present invention. In a first step to reducing the voltage values of V1(n), V2(n), V3(n) . . . VN(n), a designer chooses the noise transfer function according to design principles known in the art, and coefficient gain s0 is set equal to the coefficient gain s1. Based on the chosen values, the integrated signal is coupled directly into summation circuit 102 which feeds into quantizer 104, and only the error is now fed into the delta-sigma loop of delta-sigma modulator 100. However, if s0 were zero (0), then both the error and the integrated signal would be in the loop, which would make the voltage values of V2(n) . . . VN(n) much larger. In a second step to reducing the voltage values of VI(n), V2(n), V3(n) . . . VN(n), the values for the remaining coefficient gains are determined and chosen. After the transfer function is selected, then the gain around each loop within delta-sigma modulator 100 is fixed.

For example, for the second loop, the relationship of the coefficient gains is determined according to the following formula: C2=k1*k2*f2*aq*b1. C2 is specified by the selected noise transfer function. The values for coefficient gains b1, k1, and aq are determined and fixed by various circuit constraints that are known in modulator circuit design. Therefore, the product of the integrating coefficient and summing coefficient is fixed according to the following relationship: k2*f2=C2/(k1*aq*b1). If the value of V2(n) is greater than the maximum operation voltage (e.g., of 3 volts) for integrator 2, then coefficient gain k2 is reduced in value while coefficient gain f2 is increased in value. The designer eventually chooses the optimum or best values for coefficient gains k2 and f2 so that the maximum value is a little less than the maximum operating voltage (e.g., of 3 volts). The selected values are preferred values based on the fact that, as the value for coefficient gain f2 is increased, the output of the analog-to-digital converter utilizing delta-sigma modulator 100 becomes more sensitive to errors made in integrator 2 due to the amplification effect of coefficient gain f2.

A similar method or methods is/are able to be used to select the coefficient gains of other order loops. For example, the coefficient gains for k3 to kN and f2 to fN are able to be determined according to the following relationships:
C3=k1*k2*k3*f3*aq*b1;  C4=k1*k2*k3*k4*f4*aq*b1;
 C5=k1*k2*k3*k4*k5*f5*aq*b1     . . .
CN=kl*k2*k3*k4*k5* . . . *kN*fN*aq*b1.

With reference now to FIG. 3, a block diagram of an exemplary A/D converter chip 300 that incorporates A/D delta-sigma modulator 100 is shown. A/D converter chip 300 includes an A/D delta-sigma modulator 100 serially coupled to a decimation filter 302. Decimation filter 302, in turn, is serially coupled to a serial port 304. A serial-data input ("SDATA IN") signal 301 is inputted into A/D delta-sigma modulator 100 of A/D converter chip 300. A/D delta-sigma modulator 100 digitizes SDATA IN signal 301 and outputs the digitized signal to decimation filter 302. Decimation filter 302 receives, down-samples, and filters the digitized signal received from modulator 100 and outputs the down-sampled signal to serial port 304. Serial port 304 is typically an interface for A/D converter chip 300 to other components or devices. The down-sampled signal is outputted as a serial-data output ("SDATA OUT") signal 306 from serial port 304. A/D converter chip 300 with modulator 100 may be used in various applications such as analog-to-digital conversion in audio applications, recording studio equipment, temperature sensing devices, measuring instruments, telecommunication systems and devices, and any other suitable applications.

The present invention utilizes a high power supply V10 for first upstream integrator 1 and a low power supply V20 for driving downstream integrators 2 to N. The modulator according to the present invention provides a wider dynamic range by allowing for a larger input voltage signal through utilizing a high-powered, first, upstream integrator while, at the same time, saving physical occupying area, power consumption, and costs by using low-powered, downstream integrators.

The present invention is not in any way limited to being utilized with a specific modulator, A/D converter, or applications, and the present invention may also be used for any other suitable devices, components, or systems and utilized for any suitable application.

While the invention has been particularly shown and described with reference to a preferred embodiment, it will be understood by those skilled in the art that various changes in form and detail may be made therein without departing from the spirit and scope of the invention.

What is claimed is:

1. A modulator for an analog-to-digital converter, comprising:
   one integrator driven by one power supply that receives an analog signal wherein the one integrator integrates the analog signal;
   at least another integrator coupled to the one integrator wherein the at least another integrator is driven by at least another power supply that supplies a voltage source different from the one power supply wherein the at least another integrator integrates the analog signal;
   a summation circuit coupled to the integrator and the at least another integrator for adding together the analog signal and outputs of the one integrator and the at least another integrator; and
   a quantizer coupled to the summation circuit for quantifying from the added outputs of the summation circuit a digitized signal that is outputted as an output signal and fed back at least to the one integrator.

2. The modulator according to claim 1, wherein the one integrator and the at least another integrator each further comprises:
   a digital-to-analog converter that receives the digitized signal from the quantizer and converts the digitized signal back to another analog signal.

3. The modulator according to claim 2 further comprising:
   a dynamic-element-matching system coupled to the digital-to-analog converter wherein the dynamic-element-matching system receives the digitized signal and tracks usage of components of the digital-to-analog converter and linearizes operation of the digital-to-analog converter.

4. The modulator according to claim 1, further comprising:
   amplifiers with coefficient gains having values that are coupled to modulator components wherein the coefficient gains are determined and set so that voltage levels for the one integrator and the at least another integrator are maintained within operating and output limits.

5. The modulator according to claim 4, wherein an integrating coefficient gain k1 of the one integrator is set to have a sufficiently large value so that an integrating capacitor can be made small for the one integrator.

6. The modulator according to claim 5, wherein a second integrating coefficient gain k2 of a second one integrator of the at least another integrator is set to have a sufficiently small value so that an output voltage from the one integrator is sufficiently attenuated to a voltage value within an operating range of the second one integrator wherein the voltage value is inputted into the second one integrator.

7. The modulator according to claim 6, wherein the second integrating coefficient gain k2 is determined by C2 being equal to k1*k2*f2*aq*b1, wherein k1 is the first integrating coefficient gain, k2 is the second integrating coefficient gain, f2 is a feedforward coefficient gain for the second one integrator, aq is a gain for the quantizer, and b1 is a feedback gain for the one integrator and wherein C2 is a value selected by a noise transfer function and b1, k1, and aq are determined and fixed by circuit constraints of the modulator.

8. The modulator according to claim 7, wherein the values of k2 and f2 are adjusted and set to respective values so that a maximum output voltage of the second one integrator is set at a maximum value that is a little less than a maximum operating voltage of the second one integrator so that an amplification effect with the feedforward coefficient gain of the second one integrator occurs in order for the quantizer to become more sensitive to errors made in the second one integrator.

9. An analog-to-digital converter chip, comprising:
at least one modulator each having:
one integrator driven by one power supply that receives an analog signal wherein the one integrator integrates the analog signal,
at least another integrator coupled to the one integrator wherein the at least another integrator is driven by at least another power supply that supplies a voltage source different from the one power supply wherein the at least another integrator integrates the analog signal,
a summation circuit coupled to the integrator and the at least another integrator for adding together the analog signal and outputs of the one integrator and the at least another integrator, and
a quantizer coupled to the summation circuit for quantifying from the added outputs of the summation circuit a digitized signal that is outputted as an output signal and fed back to the one integrator; and
at least one decimation filter coupled to the at least one modulator for down-sampling and filtering an over-sampled signal portion from the digitized signal.

10. The analog-to-digital converter chip according to claim 9, wherein the one integrator and the at least another integrator each further comprises:
a digital-to-analog converter that receives the digitized signal from the quantizer and converts the digitized signal back to another analog signal.

11. The analog-to-digital converter chip according to claim 10 further comprising:
a dynamic-element-matching system coupled to the digital-to-analog converter wherein the dynamic-element-matching system receives the digitized signal and tracks usage of components of the digital-to-analog converter and linearizes operation of the digital-to-analog converter.

12. The analog-to-digital converter chip according to claim 9, further comprising:
amplifiers with coefficient gains having values that are coupled to modulator components wherein the coefficient gains are determined and set so that voltage levels for the one integrator and the at least another integrator are maintained within operating and output limits.

13. The analog-to-digital converter chip according to claim 12, wherein an integrating coefficient gain k1 of the one integrator is set to have a sufficiently large value so that an integrating capacitor can be made small for the one integrator.

14. The analog-to-digital converter chip according to claim 13, wherein a second integrating coefficient gain k2 of a second one integrator of the at least another integrator is set to have a sufficiently small value so that an output voltage from the one integrator is sufficiently attenuated to a voltage value within an operating range of the second one integrator wherein the voltage value is inputted into the second one integrator.

15. The analog-to-digital converter chip according to claim 14, wherein the second integrating coefficient gain k2 is determined by C2 being equal to k1*k2*f2*aq*b1, wherein k1 is the first integrating coefficient gain, k2 is the second integrating coefficient gain, f2 is a feedforward coefficient gain for the second one integrator, aq is a gain for the quantizer, and b1 is a feedback gain for the one integrator and wherein C2 is a value selected by a noise transfer function and b1, k1, and aq are determined and fixed by circuit constraints of the modulator.

16. The analog-to-digital converter chip according to claim 15, wherein the values of k2 and f2 are adjusted and set to respective values so that a maximum output voltage of the second one integrator is set at a maximum value that is a little less than a maximum operating voltage of the second one integrator so that an amplification effect with the feedforward coefficient gain of the second one integrator occurs in order for the quantizer to become more sensitive to errors made in the second one integrator.

17. The analog-to-digital converter chip according to claim 9 further comprising:
a serial port coupled to the at least one decimation filter wherein the serial port receives the digitized signal from the at least one decimation filter and outputs the digitized signal therefrom.

18. A method of modulating a signal for an analog-to-digital converter, comprising the steps of:
integrating an analog signal by one integrator that is driven by one power supply;
integrating the analog signal by at least another integrator that is driven by at least another power supply that supplies a voltage source different from the one power supply;
summing, by a summation circuit, the analog signals and outputs of the one integrator and the at least another integrator; and
quantifying, by a quantizer, from the added outputs of the summation circuit a digitized signal that is outputted as an output signal and fed back to the one integrator.

19. The method according to claim 18, further comprising the steps of:
receiving, by a digital-to-analog converter that is each coupled to the one integrator and the at least another integrator, the digitized signal fed back from the quantizer; and
converting, by the digital-to-analog converter, the digitized signal back to another analog signal.

20. The method according to claim 19 further comprising the steps of:
receiving, by a dynamic-element-matching system coupled to the digital-to-analog converter, the digitized signal;
tracking, by the dynamic-element matching system, usage of components of the digital-to-analog converter; and
linearizing, by the dynamic-element matching system, operation of the digital-to-analog converter.

21. The method according to claim 20 further comprising the step of:
determining and setting values for coefficient gains of modulator components so that voltage levels for the one integrator and the at least another integrator are maintained within operating and output limits.

22. The method according to claim 21, further comprising the step of:
setting an integrating coefficient gain k1 of the one integrator to have a sufficiently large value so that an integrating capacitor can be made small for the one integrator.

23. The method according to claim 22, further comprising the step of:

setting a second integrating coefficient gain k2 of a second one integrator of the at least another integrator to have a sufficiently small value so that an output voltage from the one integrator is sufficiently attenuated to a voltage value within an operating range of the second one integrator wherein the voltage value is inputted into the second one integrator.

24. The method according to claim 23, further comprising the step of:

determining the second integrating coefficient gain k2 by C2 being equal to k1*k2*f2*aq*b1, wherein k1 is the first integrating coefficient gain, k2 is the second integrating coefficient gain, f2 is a feedforward coefficient gain for the second one integrator, aq is a gain for the quantizer, and b1 is a feedback gain for the one integrator and wherein C2 is a value selected by a noise transfer function and b1, k1, and aq are determined and fixed by circuit constraints of the modulator.

25. The method according to claim 24, further comprising the step of:

adjusting and setting the values of k2 and f2 to respective values so that a maximum output voltage of the second one integrator is set at a maximum value that is a little less than a maximum operating voltage of the second one integrator so that an amplification effect with the feedforward coefficient gain of the second one integrator occurs in order for the quantizer to become more sensitive to errors made in the second one integrator.

26. A method for operating two or more integrators for a modulator of an analog-to-digital converter with different power supplies, comprising the steps of:

operating one integrator with one power supply;

operating at least another integrator with at least another power supply that supplies a voltage source different from the one power; and determining and setting values for coefficient gains of modulator components so that voltage levels for the one integrator and the at least another integrator are maintained within operating and output limits.

* * * * *